United States Patent [19]
Lehner

[11] 3,859,127
[45] Jan. 7, 1975

[54] METHOD AND MATERIAL FOR PASSIVATING THE JUNCTIONS OF MESA TYPE SEMICONDUCTOR DEVICES

[75] Inventor: Leo L. Lehner, Scottsdale, Ariz.

[73] Assignee: Motorola, Inc., Franklin Park, Ill.

[22] Filed: Jan. 24, 1972

[21] Appl. No.: 204,667

[52] U.S. Cl. ............. 117/212, 117/106 A, 117/200, 117/213, 156/17, 29/580, 29/583
[51] Int. Cl. ........................... B01j 17/00, H01l 5/00
[58] Field of Search ....... 117/212, 213, 106 A, 200; 156/17; 317/235 AT; 29/580, 583

[56] References Cited

UNITED STATES PATENTS

| | | | |
|---|---|---|---|
| 3,385,729 | 5/1968 | Larchian | 117/200 |
| 3,386,865 | 6/1968 | Doo | 148/175 |
| 3,416,224 | 12/1968 | Armstrong | 29/580 |
| 3,500,139 | 3/1970 | Claude-Frouin et al. | 317/235 |
| 3,579,815 | 5/1971 | Gentry | 29/580 |
| 3,624,467 | 11/1971 | Bean | 317/235 R |
| 3,698,947 | 10/1972 | Kemlage | 117/212 |

*Primary Examiner*—Leon D. Rosdol
*Assistant Examiner*—M. F. Esposito
*Attorney, Agent, or Firm*—Vincent J. Rauner; Henry T. Olsen

[57] ABSTRACT

The method of producing mesa type semiconductor devices having passivated mesa junctions comprises the steps of providing a wafer having layers of P and N type semiconductor material deposited thereon removing semiconductor material from the layers at spaced intervals, preferably by etching, depositing high resistivity polycrystalline silicon material in the valleys created by removing the semiconductor material to passivate the mesa junctions and separating adjacent semiconductor devices by cutting through the wafer therebetween.

4 Claims, 6 Drawing Figures

METHOD AND MATERIAL FOR PASSIVATING THE JUNCTIONS OF MESA TYPE SEMICONDUCTOR DEVICES

BACKGROUND OF THE INVENTION

This invention relates generally to mesa type semiconductor devices and more particularly to the passivation of the mesa junctions of said devices and a method for carrying out the latter.

One method for producing mesa type semiconductor devices is to provide on a substrate or wafer, layers of N and P type semiconductor material. Chemical solutions placed at spaced intervals along the top layer of material etches through the semiconductor layers to form spaced U-shaped valleys. Between the valleys are formed the mesa shaped semiconductor devices. Scribing through the substrate separates the interconnected semiconductor devices to complete the process.

Currently, passivation of the mesa junction takes place subsequent to the separation of the mesa type devices. Normally, the mesa devices are coated with a varnish or the like solution for passivation thereof.

The above technique for passivation of the mesa junction is not entirely satisfactory. Becauase the varnish solution is applied to the semiconductor devices well after they have been separated and at a time removed from the actual fabrication thereof, it is difficult to maintain the mesa junctions contaminant free in the interim period. Furthermore, it is difficult to maintain the varnish itself contaminant free, and the varnish coating is subject to temperature changes, etc.

SUMMARY OF THE INVENTION

Accordingly, it is an object of the present invention to provide an improved material for passivation of the junctions of mesa type semiconductor devices which overcomes the drawbacks of the prior art.

It is another object of the present invention to provide a new and improved method for passivating the junctions of mesa type semiconductor devices.

It is yet another object of the invention to provide a new and improved method for fabricating mesa type semiconductor devices having passivated mesa junctions.

Briefly, the method according to the invention comprises the steps of providing a wafer having a layer or layers of P and/or N type semiconductor material deposited thereon, etching the layers at spaced intervals to provide a mesa type semiconductor device therebetween, depositing high resistivity polycrystalline silicon material in the valleys created by etching the layers to passivate the mesa junctions of adjacent mesa type semiconductor devices and separating the mesa junction devices thereafter.

Preferably, the polycrystalline silicon is deposited by passing a wafer including the attached mesa semiconductor components into a heated chamber having an atmosphere of $SiCl_4$ and $H_2$. The latter combine to form a polycrystalline silicon coating over the outer surfaces of the devices. The coating provides a barrier to contaminants which, if were permitted, would impair the stability of the completed semiconductor devices.

DETAILED DESCRIPTION

Figure 1:
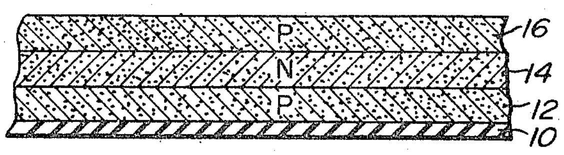
FIGS. 1–6 comprise a diagrammatic representation of the steps for making a mesa type semiconductor device having a passivated mesa junction, according to the invention.

Referring now to the drawing, initially in the method according to the invention, as shown in FIG. 1, there is provided a substrate or wafer 10 such as, for example, a layer of single crystalline silicon material, upon which there is deposited a layer or layers of P and/or N type semiconductor material. In the specific example shown, three layers 12, 14, 16, are deposited in succession on the substrate 10 to produce a transistor device of the PNP type. The method of the invention, however, is not restricted to transistor devices but is employed equally as well with other mesa type semiconductor components.

Figure 2:
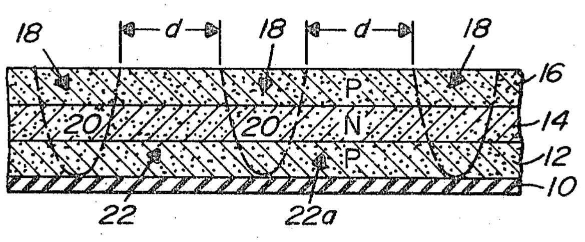
Figure 3:
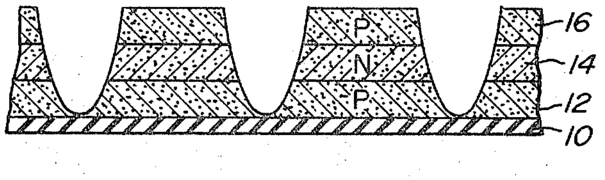
Figure 4:
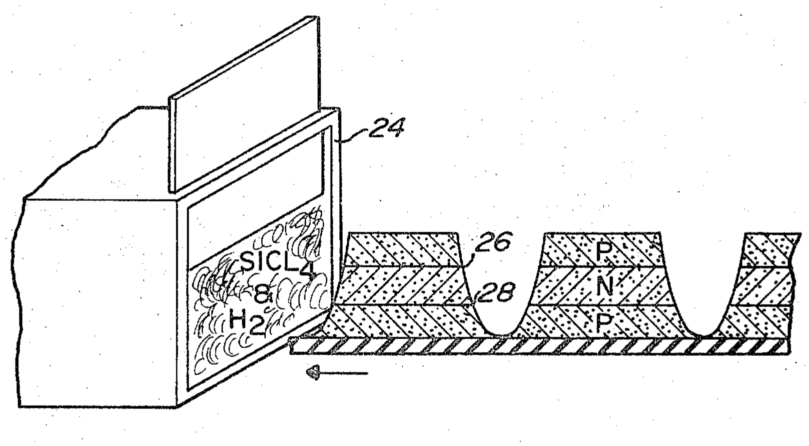

Next, removal of the layers of semiconductor material at spaced intervals takes place. Preferably, a section of material, designated generally by the number 18, is removed by etching. The latter is accomplished by applying a chemical etching solution at spaced intervals *d* along the top layer 16. The chemical solution etches material 18 away in a pattern illustrated in dotted lines 20 of FIG. 2 to form a plurality of mesa type semiconductor devices **22, 22*a*, etc., along substrate 10 (FIG. 3). The etching material does not sever the substrate layer 10.**

Subsequent to the etching step, the substrate 10 including the semiconductor devices is passed through a chamber 24 wherein there is provided a gaseous atmosphere of $SiCl_4$ and $H_2$. The substrate and semiconductor devices are heated in the chamber and polycrystalline silicon is chemically formed thereover including junctions 26, 28, between the layers of semiconductor material, thereby passivating the mesa junctions. The latter is performed almost immediately after etching to prevent contaminants which could render a completed semiconductor device unstable electrically, from being deposited at the junctions.

Figure 5:
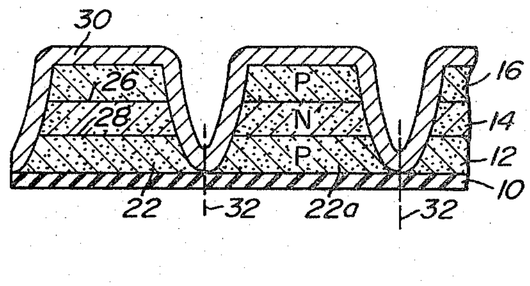

Upon exiting the chamber, the semiconductors appear as in FIG. 5 with a layer 30 of polycrystalline silicon material deposited thereover, fully protecting the mesa junctions 26, 28. It should be noted that other techniques for deposited polycrystalline silicon may be used and still fall within the scope of the invention. However, it has been found that the method described is desirable since high resistivity polycrystalline silicon is produced there-by and because of the relatively low cost and reliability thereof.

Figure 6:
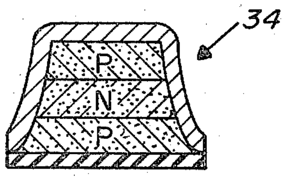

Once removed from the chamber 24, the substrate 10 is severed by scribing and breaking or cutting along lines 32 falling between the mesa junction devices. The layer of polycrystalline silicon material is severed as well, to produce individual mesa type semiconductor devices having passivated mesa junctions, such as 34, (FIG. 6).

The polycrystalline silicon material formed or "grown" chemically on the semiconductor layers is substantially free of impurities and thus has a relatively high resistivity of approximately $10^6$ ohm-cm. The high resistivity polycrystalline silicon provides a barrier to contaminants and the polycrystalline layer is firmly bonded to the silicon so that its protection is long term.

I claim:

1. The method of providing mesa type semiconductor components having passivated mesa junctions, comprising the steps of: providing a silicon substrate having layers of P and N type silicon semiconductor material deposited thereon, removing the layers at spaced intervals to provide mesa type semiconductor devices therebetween, depositing polycrystalline silicon material in the valleys formed by the removal of said material for passivating the mesa junctions of said semiconductor devices and separating the mesa type semiconductor devices into individual units.

2. The method of claim 1 wherein the removal of the semiconductor material includes etching of said material by chemical means.

3. The method of claim 1 wherein the deposition of polycrystalline silicon material includes the steps of:

providing a chamber containing an atmosphere of a gaseous silicon compound and exposing the interconnected semiconductor devices to said atmosphere thereby to form polycrystalline silicon at the mesa junctions of said components.

4. The method of claim 1 wherein said gaseous atmosphere comprises silicon tetrachloride and hydrogen.

* * * * *